US012753504B2

(12) United States Patent
Takamura

(10) Patent No.: US 12,753,504 B2
(45) Date of Patent: Oct. 6, 2026

(54) FILM FORMING APPARATUS

(71) Applicant: Tokyo Electron Limited, Tokyo (JP)

(72) Inventor: Yuya Takamura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 300 days.

(21) Appl. No.: 17/807,506

(22) Filed: Jun. 17, 2022

(65) Prior Publication Data

US 2022/0411933 A1 Dec. 29, 2022

(30) Foreign Application Priority Data

Jun. 29, 2021 (JP) ................................ 2021-107391

(51) Int. Cl.
*C23C 16/455* (2006.01)
*C23C 16/458* (2006.01)

(52) U.S. Cl.
CPC .. *C23C 16/45578* (2013.01); *C23C 16/45544* (2013.01); *C23C 16/4587* (2013.01)

(58) Field of Classification Search
CPC ................................................ C23C 16/45578
See application file for complete search history.

(56) References Cited

U.S. PATENT DOCUMENTS 4,082,865 A * 4/1978 Ban ........................ C30B 25/12 438/782
4,096,822 A * 6/1978 Yamawaki ........ C23C 16/45578 118/500
4,499,853 A * 2/1985 Miller ..................... C30B 25/14 118/725
2003/0186517 A1* 10/2003 Takagi .................... H01L 21/67 118/724
2005/0045102 A1* 3/2005 Zheng ............... C23C 16/45578 118/722
2014/0345801 A1* 11/2014 Yang ................... C23C 16/4412 118/712
2015/0275368 A1* 10/2015 Motoyama ........ C23C 16/45578 118/728
2016/0333478 A1* 11/2016 Tatsuoka ........... C23C 16/45574
2018/0076021 A1* 3/2018 Fukushima ....... H01L 21/67109
2018/0090322 A1* 3/2018 Jung .................. C23C 16/4412
2018/0264516 A1* 9/2018 Fujikawa ............... B05D 1/002
2022/0189809 A1* 6/2022 Curry .................. C23C 16/4412

FOREIGN PATENT DOCUMENTS

JP 2007-027425 2/2007
JP 2012-209517 10/2012

* cited by examiner

*Primary Examiner* — Keath T Chen
(74) *Attorney, Agent, or Firm* — IPUSA, PLLC

(57) ABSTRACT

A film forming apparatus according to one aspect of the present disclosure includes a processing chamber, a gas supply pipe extending vertically in the processing chamber and including gas holes, and a boat configured to accommodate substrates including product substrates in a vertical direction in the processing chamber. The film forming apparatus forms a film on each of the substrates by use of gas supplied from the gas holes, each of the substrates corresponding to respective one or more of gas holes. The gas holes that are arranged in a height range in which the product substrates are situated include first gas holes that are opened at a same height, the first gas holes being oriented at respective angles such that respective imaginary lines passing through the first holes and a central axis of the gas supply pipe are at a same angle relative to an imaginary line.

6 Claims, 10 Drawing Sheets

FIG.7

| INTER-SURFACE UNIFORMITY | TOP | TC-1 | TC-2 | CTR | CB-1 | CB-2 | BTM |
|---|---|---|---|---|---|---|---|
| ±1.5%/ CONVEX | 7.5° | 10° | 7.5° | 10° | 12.5° | 22.5° | 27.5° |
| ±1.0%/ CONVEX | 22.5° | 25° | 25° | 27.5° | 30° | 52.5° | 55° |
| ±1.0%/ CONCAVE | 75° | 77.5° | 75° | 70° | 67.5° | 65° | 70° |

FILM FORMING APPARATUS

CROSS-REFERENCE TO RELATED APPLICATIONS

This patent application is based upon and claims priority to Japanese Patent Application No. 2021-107391 filed on Jun. 29, 2021, the entire contents of which are incorporated herein by reference.

TECHNICAL FIELD

The present disclosure relates to a film forming apparatus.

BACKGROUND

In manufacture of semiconductor devices, various heat treatment devices are used to apply heat treatment such as oxidation, diffusion, CVD, annealing, or the like to a semiconductor wafer (see, for example, Patent Document 1).

RELATED ART DOCUMENTS

Patent Documents

[Patent Document 1] Japanese Patent Application Laid-Open No. 2012-209517

SUMMARY

The present disclosure provides a technique for improving controllability of an inplane distribution of a film.

According to one aspect of the present disclosure, a film forming apparatus includes a processing chamber, a gas supply pipe extending vertically in the processing chamber and including a plurality of gas holes, and a boat configured to accommodate a plurality of substrates including product substrates in a vertical direction in the processing chamber, wherein the film forming apparatus forms a film on each of the plurality of substrates by use of gas supplied from the plurality of gas holes, each of the plurality of substrates corresponding to respective one or more of the plurality of gas holes, and wherein gas holes among the plurality of gas holes that are arranged in a height range in which the product substrates are situated include first gas holes that are opened at a same height, the first gas holes being oriented at respective angles such that respective imaginary lines passing through the first holes and a central axis of the gas supply pipe are at a same angle relative to an imaginary line passing through the central axis of the gas supply pipe and a center of a corresponding one of the product substrate.

BRIEF DESCRIPTION OF THE DRAWINGS

FIG. 7 is a table illustrating an example of a measurement result of the angle of the gas hole and the inplane distribution of a film thickness according to an embodiment;

DETAILED DESCRIPTION OF EMBODIMENTS

Figure 1:
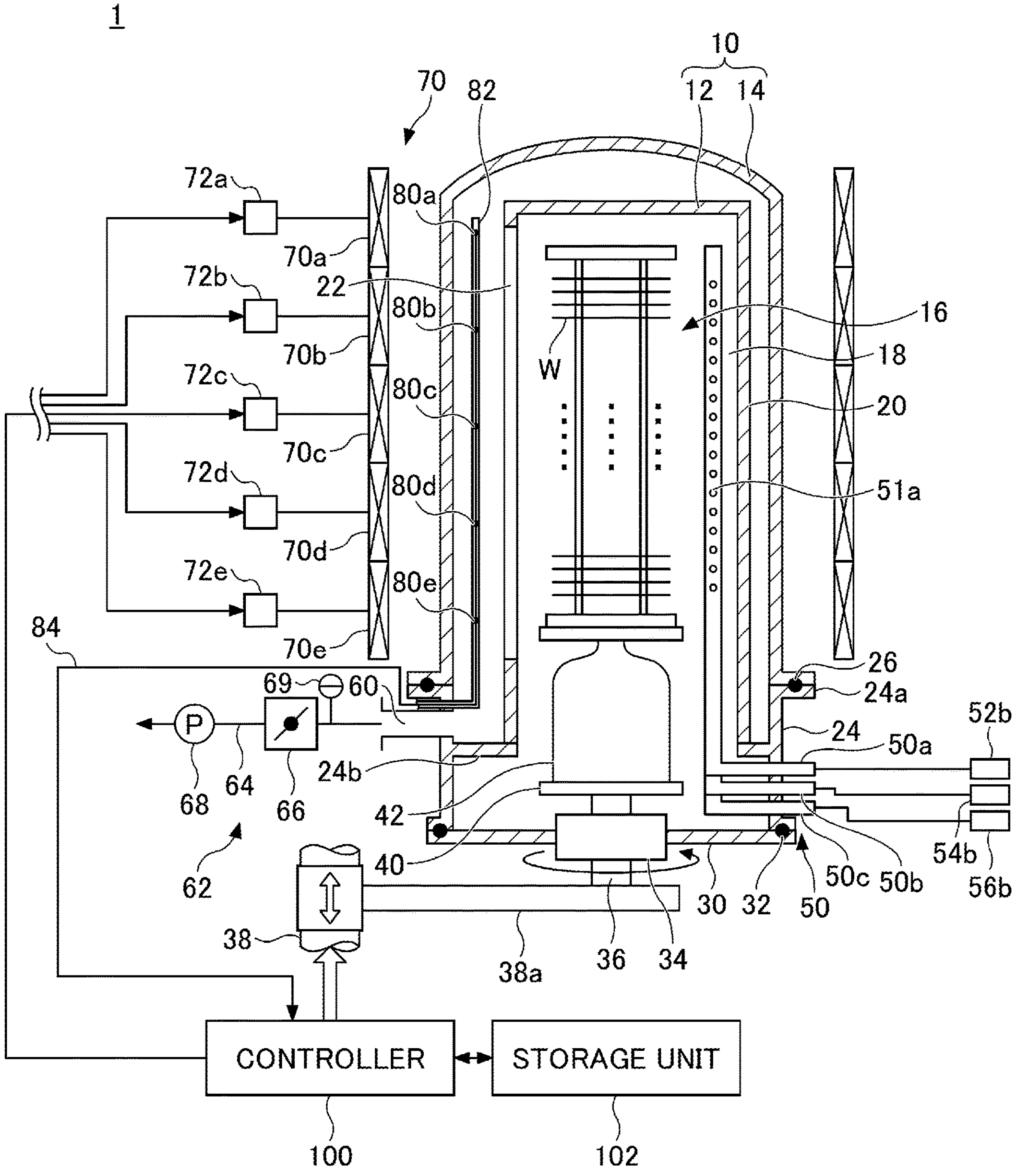
FIG. 1 is a cross-sectional view illustrating an example of the overall configuration of a film forming apparatus according to an embodiment.

Hereinafter, non-limiting exemplary embodiments of the present disclosure will be described with reference to the accompanying drawings. In all the accompanying drawings, the same or corresponding reference numerals shall be attached to the same or corresponding components and overlapping descriptions may be omitted.

<Film Forming Apparatus>

Figure 2:
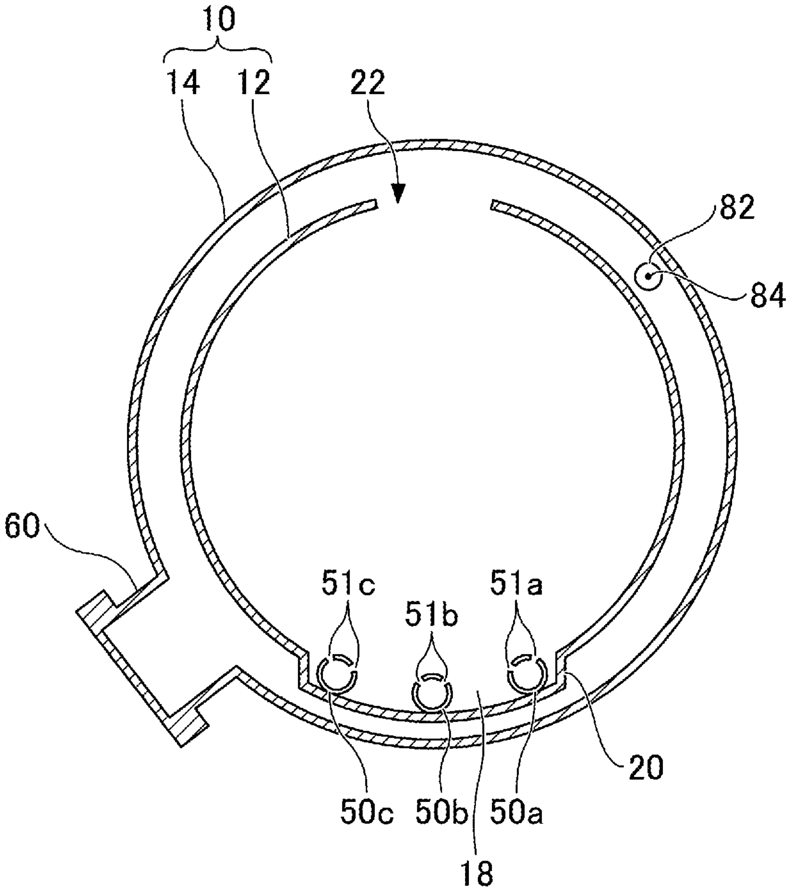
FIG. 2 is a diagram for explaining a processing chamber.

A film forming apparatus according to an embodiment will be described. FIG. 1 is a cross-sectional view illustrating an example of the overall configuration of a film forming apparatus according to an embodiment. FIG. 2 is a diagram for explaining a processing chamber.

As illustrated in FIG. 1, a film forming apparatus 1 includes a processing chamber 10. The processing chamber 10 includes a cylindrical inner tube 12 having a ceiling and an open lower end and a cylindrical outer tube 14 having a ceiling and an open lower end and configured to cover the outside of the inner tube 12. The inner tube 12 and the outer tube 14 are formed of an insulating material such as quartz, and coaxially arranged to form a double tube structure. A wafer boat 16 is a substrate holder having slots that hold a substrate W generally horizontally at predetermined intervals along the top and bottom. An example of the substrate W is a wafer with a diameter of 300 mm.

The ceiling of the inner tube 12 is, for example, flat. A nozzle accommodation portion 18 is formed at one side of the inner tube 12 and accommodates a gas supply pipe along the longitudinal direction (vertical direction) of the inner tube 12. For example, as illustrated in FIG. 2, the nozzle accommodation portion 18 is a portion of the inside of a block portion 20 formed by protruding a portion of a side wall of the inner tube 12 toward the outside. A rectangular opening 22 is formed on a side wall of an opposite side of the inner tube 12 facing the nozzle accommodation portion 18 along the longitudinal direction (vertical direction) of the inner tube 12.

The opening 22 is a gas exhaust port formed so as to exhaust the gas in the inner tube 12. The opening 22 has the same length as a length of the wafer boat 16, or extends in both the upper and lower directions to be longer than the length of the wafer boat 16.

A lower end of the processing chamber 10 is supported by a cylindrical manifold 24 made of, for example, stainless steel. A flange portion **24*a* is formed on an upper end of the manifold 24, and a lower end of the outer tube 14 is installed to be supported on the flange portion 24*a*. A seal member 26 (e.g., an O-ring) is interposed between the flange portion 24*a* and the lower end of the outer tube 14 so that the inside of the outer tube 14** is air-tightly sealed.

An annular support 24*b* is provided at an inner wall of the upper portion of the manifold 24, and a lower end of the inner tube 12 is installed to be supported on the support 24*b*. A cover 30 is air-tightly attached to an opening at the lower end of the manifold 24 through a seal member 32 (e.g., an O-ring) so as to air-tightly close the opening at the lower end of the processing chamber 10, that is, the opening of the manifold 24. The cover 30 is made of, for example, stainless steel.

A rotation shaft 36 is provided at the center portion of the cover 30 to penetrate through a magnetic fluid sealing portion 34. A lower portion of the rotation shaft 36 is rotatably supported by an arm 38*a* of a lifting unit 38 including a boat elevator.

A rotation plate 40 is provided at the upper end of the rotation shaft 36, and the wafer boat 16 that holds the substrate W is placed on the rotation plate 40 via a heat retention pedestal 42 made of quartz. Therefore, the cover 30 and the wafer boat 16 are integrally moved up and down by moving the lifting unit 38 up and down, so that the wafer boat 16 can be inserted into or removed from the processing chamber 10.

A gas supply 50 is provided at the manifold 24, and introduces a gas into the inner tube 12. The gas supply 50 includes a plurality (three in the illustrated example) of gas supply pipes 50*a*, 50*b*, and 50*c* made of quartz. Each of the gas supply pipes 50*a*, 50*b*, and 50*c* extends vertically along the longitudinal direction thereof, and its base end is bent in an L-shape and supported so as to penetrate the manifold 24. The gas supply pipes 50*a*, 50*b*, and 50*c* are collectively referred to as gas supply pipes 50.

As illustrated in FIG. 2, the gas supply pipes 50*a*, 50*b*, and 50*c* are provided to be aligned in a line along the circumferential direction in the nozzle accommodating portion 18 of the inner tube 12. Each of the gas supply pipes 50*a*, 50*b*, and 50*c* has a plurality of gas holes 51*a*, 51*b*, and 51*c* at predetermined intervals along the longitudinal direction. There are two gas holes 51*a*, one gas hole 51*b*, and two gas holes 51*c*. The gas holes 51*a*, 51*b*, and 51*c* are collectively referred to as gas holes 51. Details of the gas holes 51*a*, 51*b*, and 51*c* will be described below.

Each of the gas holes 51*a*, 51*b*, and 51*c* ejects each gas in the horizontal direction. The predetermined intervals are set to be, for example, the same as the intervals of the substrates W supported by the wafer boat 16. Further, a position in a height direction is set such that each of the gas holes 51*a*, 51*b*, and 51*c* is positioned in the middle of the substrates W adjacent in the vertical direction, and each gas can be efficiently supplied to the space between the substrates W. Gas supply sources 52*b*, 54*b*, 56*b* are connected to the gas supply pipes 50*a*, 50*b*, and 50*c* via flow rate controllers, valves, or the like (not illustrated), respectively. The gas supply sources 52*b*, 54*b*, and 56*b* are supply sources for film forming gas, etching gas, and purge gas, respectively. The flow rate of each gas from the gas supply sources 52*b*, 54*b*, 56*b* is controlled by the flow rate controller, and each gas is supplied into the processing chamber 10 via the gas supply pipes 50*a*, 50*b*, and 50*c* as needed.

A gas outlet 60 is formed above the support 24*b* that is a side wall of the upper portion of the manifold 24, and is configured to be able to exhaust the gas in the inner tube 12 discharged from the opening 22 through a space between the inner tube 12 and the outer tube 14. The gas outlet 60 is provided at a position different from the opening 22 in the circumferential direction of the inner tube 12. In the illustrated example, the gas outlet 60 is provided at a position shifted by 120 degrees counterclockwise from the position of the opening 22 in the circumferential direction of the inner tube 12. The gas outlet 60 is provided with an exhaust unit 62. The exhaust unit 62 includes an exhaust passage 64 connected to the gas outlet 60, and a pressure adjusting valve 66 and a vacuum pump 68 are sequentially interposed in the exhaust passage 64 so as to evacuate the inside of the processing chamber 10. A pressure sensor 69 is also provided upstream of the pressure adjusting valve 66 of the exhaust passage 64 to detect the pressure in the processing chamber 10.

A cylindrical heater 70 is provided to cover the outer tube 14 around the outer tube 14. The heater 70 heats the substrates W accommodated in the processing chamber 10. Further, the heater 70 is also divided into heaters 70*a*, 70*b*, 70*c*, 70*d*, and 70*e* so as to correspond one-to-one with the unit regions along the vertical direction. The outputs of the heaters 70*a* to 70*e* are independently controlled by power controllers 72*a* to 72*e*, respectively.

Further, in the space in the processing chamber 10, temperature sensors 80*a* to 80*e* configured to detect the temperature are provided. The temperature sensors 80*a* to 80*e* detect the temperature to detect the temperature distribution along the vertical direction. The temperature sensors 80*a* to 80*e* are accommodated in a protection tube 82 made of, for example, quartz, and are provided between the inner tube 12 and the outer tube 14. As illustrated in FIG. 2, the temperature sensors 80*a* to 80*e* and the protection tube 82 configured to accommodate the temperature sensors 80*a* to 80*e* are provided at a position shifted by a predetermined angle from the position of the opening 22 in the circumferential direction of the inner tube 12. Therefore, since the temperature sensors 80*a* to 80*e* are positioned at a blind spot from the gas supply pipes 50*a*, 50*b*, and 50*c*, the detected temperature of the temperature sensors 80*a* to 80*e* can be controlled from being lowered by the gases ejected from the gas supply pipes 50*a*, 50*b*, and 50*c*. For example, a thermocouple, or a resistance temperature detector may be used as the temperature sensors 80*a* to 80*e*.

Detection signals from the temperature sensors 80*a* to 80*e* are input to a controller 100 (to be described later) via a signal line 84. The controller 100 to which the detection signals are input calculates set values of the power controllers 72*a* to 72*e*, and outputs the calculated set values to each of the power controllers 72*a* to 72*e*. For example, by calculating the set values of the power controllers 72*a* to 72*e* by PID control, the controller 100 controls the output to each of the power controllers 72*a* to 72*e*, that is, the amount of heat generated by each of the heaters 70*a* to 70*e*.

The film forming apparatus 1 includes the controller 100 such as a computer configured to control the entire operation of the film forming apparatus 1. The controller 100 is connected to a storage unit 102 that stores control programs for realizing various processing executed by the film forming apparatus 1 by the controller 100, or various programs for causing respective components of the film forming apparatus 1 to execute processing according to processing conditions. The various programs may be stored in a storage medium and then stored in the storage unit 102. The storage medium may be a hard disk or a semiconductor memory, or may be a portable medium such as a CD-ROM, a DVD, or a flash memory. Further, the storage unit 102 may appropriately communicate with other devices or a host computer by a wired or wireless communication unit. The controller 100 may be a controller provided separately from the film forming apparatus 1. Further, the storage unit 102 may be a storage device provided separately from the film forming apparatus 1.

<Film Forming Method>

Next, a film forming method according to an embodiment will be described with reference to an example in which a thin film is formed by an atomic layer deposition (ALD) method using the film forming apparatus 1 described above. Examples of the thin film that may be formed by the film forming method according to the embodiment may include an oxide film such as $SiO_2$, $ZrO_2$, $HfO_2$, $TiO_2$, and $Al_2O_3$, a nitride film such as SiN, HfN, TiN, and AlN, or a composite film in which the above compounds are combined such as ZrAlO, HfAlO, and HfSiON, a laminated film of SiN and $SiO_2$, and the like.

Hereinafter, descriptions will be made for a case where a silicon nitride (SiN) film is formed on the substrate W using a silicon-containing gas and a nitride gas as raw material gases.

First, in a film forming preparation processing, the wafer boat 16 holding a plurality of substrates W is carried into the processing chamber 10 by the lifting unit 38, and the opening at the lower end of the processing chamber 10 is air-tightly closed to be sealed by the cover 30. Further, in the film forming preparation processing, the opening at the lower end of the processing chamber 10 is opened, so that the temperature in the processing chamber 10 is lowered. Therefore, the controller 100 controls the outputs of the heaters 70*a* to 70*e* based on the detected temperature of the temperature sensors 80*a* to 80*e* such that the lowered temperature in the processing chamber 10 is maintained at the set temperature (e.g., 300° C. to 700° C.) determined in advance by, for example, a recipe.

Subsequently, inert gas is continuously supplied at the same flow rate as the average flow rate of the total gas supplied into the processing chamber 10, and the pressure in the processing chamber 10 is maintained at the same pressure as the average pressure in the processing chamber 10. In the film forming preparation processing, the heater 80 heats the substrate W in the processing chamber 10 to stabilize the temperature. These can be done, for example, while rotating the wafer boat 16. Further, in the film forming preparation processing, the controller 100 controls the outputs of the heaters 70*a* to 70*e* based on the detected temperature of the temperature sensors 80*a* to 80*e* such that the reduced temperature in the processing chamber 10 is maintained at the set temperature (e.g., 300° C. to 700° C.) determined in advance by, for example, a recipe. The set temperature may be the same as the set temperature in the film forming processing from the viewpoint that the temperature fluctuation is reduced at the time of transition from the film forming preparation processing to the film forming processing (to be described later).

Subsequently, in the film forming processing, by the ALD method, a silicon nitride film is formed on the substrate W accommodated in the processing chamber 10. In the embodiment, the silicon-containing gas from the gas supply pipe 50*a*, the inert gas from the gas supply pipe 50*c*, the nitride gas from the gas supply pipe 50*b*, and the inert gas from the gas supply pipe 50*c* are intermittently supplied in this order. Therefore, the silicon-containing gas is adsorbed on the substrates W in the first step of supplying the silicon-containing gas (an adsorption step), and the excess silicon-containing gas is purged in the next step of supplying the inert gas. Then, the nitride gas supplied in the next step of supplying the nitride gas is reacted with the silicon-containing gas (a nitriding step), and the excess nitride gas is purged by the next step of supplying the inert gas (a second purge step), and then, a thin unit film which is almost a mono-molecular layer is formed. A silicon nitride film having a desired film thickness is formed by performing the series of cycles a predetermined number of times. The controller 100 controls the outputs of the heaters 70*a* to 70*e* based on the detected values of the temperature sensors 80*a* to 80*e* such that the temperature in the processing chamber 10 is maintained at the set temperature (e.g., 300° C. to 700° C.) determined in advance by, for example, a recipe.

<Inplane Uniformity of Film Thickness>

Figure 3:
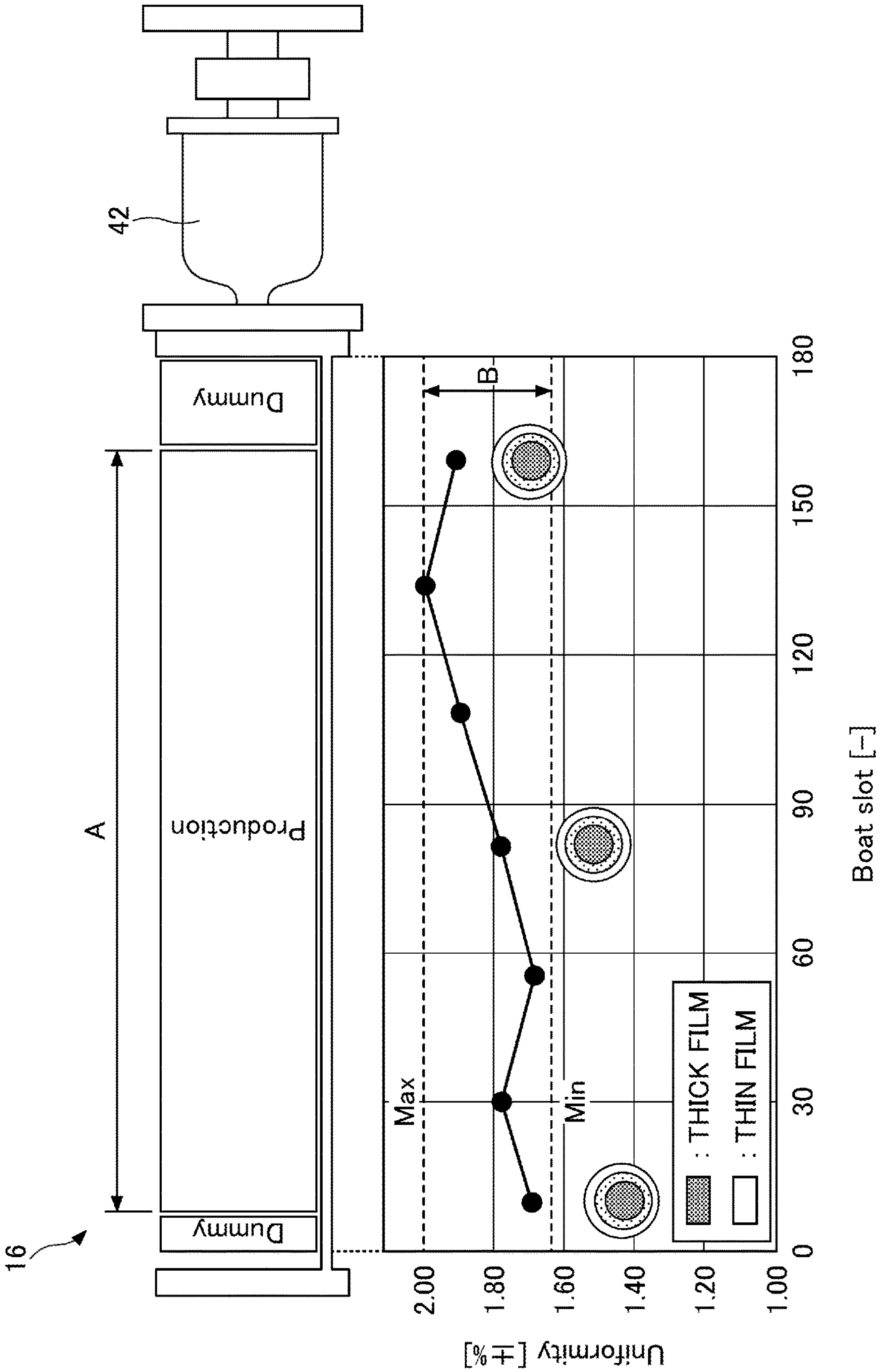
FIG. 3 is a diagram for explaining a problem of an inplane uniformity of a film thickness.

Next, inplane uniformity of the film formed on the substrate will be described with reference to FIG. 3. FIG. 3 is a diagram for explaining a problem of an inplane uniformity of a film thickness. In FIG. 3, the wafer boat 16 is illustrated lying down. The top of the wafer boat 16 is illustrated to the left and the bottom of the wafer boat 16 is illustrated to the right. In FIG. 3, a range of heights at which a plurality of product substrates (Production) are positioned out of multiple slots in the wafer boat 16 is illustrated as a space A. A dummy substrate (Dummy) is arranged at both ends (top and bottom).

In the space of A in the wafer boat 16 in which the plurality of product substrates are disposed in the processing chamber 10, for example, gas holes are provided in the gas supply pipe. The gas holes are arranged in the longitudinal direction one by one being opened in the same direction as an imaginary line that connects a central axis of the product substrate and a central axis of the gas supply pipe. When the gas is supplied from the gas supply pipes 50*a* to 50*c*, the gas is supplied from the bottom to the top in order. Therefore, the flow rate of the gas supplied from the gas hole located at the bottom is the largest, and the flow rate of the gas supplied from the gas hole decreases as it is closer to the top. In the graph of FIG. 3, the horizontal axis is the number of the slot on which the substrate of the wafer boat 16 (including the product substrate and the dummy substrate) is placed, and the vertical axis is the inplane uniformity of the film formed on each substrate as a percentage. The greater the inplane uniformity of the film, the higher the uniformity. As a result, in the space A in the wafer boat 16, the film thickness becomes thicker and the inplane uniformity becomes higher because the flow rate of the gas supplied on the bottom side is larger than that on the top side. Accordingly, the difference illustrated in B is generated in the inplane uniformity of the film formed in the region from the bottom to the top. The graph of FIG. 3 illustrates the result of flowing Si gas from the gas supply pipe. As for the inplane distribution of the film formed on the substrate, the center is thick and the periphery is thin in any of the slots from the bottom to the top.

<Position and Angle of Gas Holes>

Figure 4:
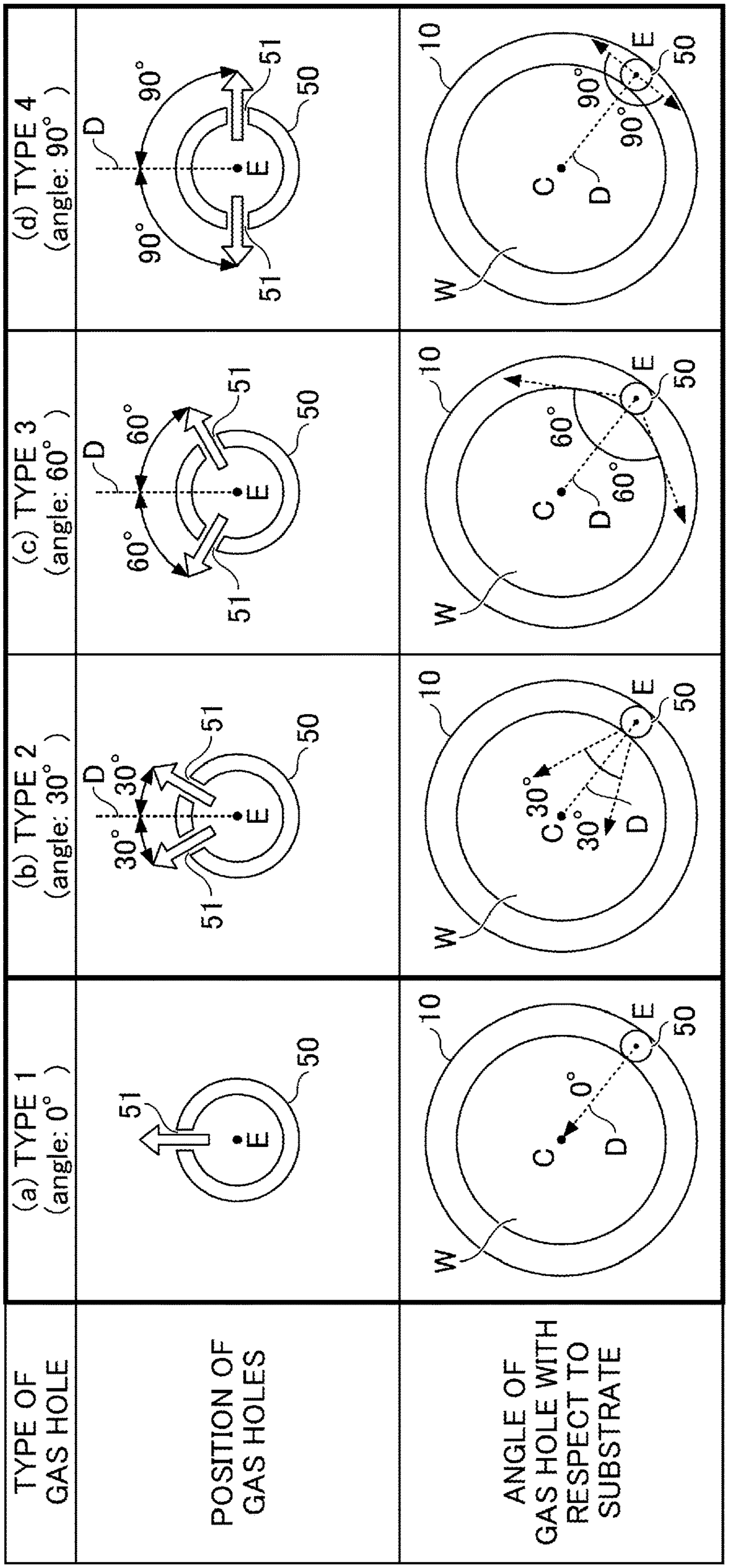
FIG. 4 is a diagram illustrating an example of a position and an angle of various gas holes according to an embodiment.

In the gas supply pipe 50 according to the present embodiment, the gas holes 51 are arranged at a predetermined angle. The position and the angle of the gas holes will be described with reference to FIG. 4. FIG. 4 is a diagram illustrating an example of the positions and angles of various gas holes according to the embodiment.

FIG. 4 illustrates types of holes that can be used for the gas holes formed in the gas supply pipe 50. The angles of the openings of the gas hole 51 of the hole type of (a) to (d) are 0°, 30°, 60°, and 90°, each angle being made between an imaginary line passing through a gas hole of the gas holes 51 and a point E on the central axis of the gas supply pipe 50 and an imaginary line D connecting a point C on the central axis passing through the center of each of the plurality of product substrates and the point E.

A gas hole type 1 of (a) of FIG. 4 indicates a gas hole 51 that is opened in the same direction as the imaginary line D connecting the point C on the central axis and the point E on the central axis of the gas supply pipe 50. In the gas hole 51 of the gas hole type 1, gas can be supplied straight from the gas supply pipe 50 toward the center of the product substrate W.

A gas hole type 2 of (b) of FIG. 4 indicates two gas holes 51 that are opened at the same height and at the same angle of 30°, made between an imaginary line passing through a gas hole of the gas holes 51 and the point E on the central axis of the gas supply pipe 50 and the imaginary line D connecting the point C on the central axis and the point E on the central axis of the gas supply pipe 50.

A gas hole type 3 of (c) of FIG. 4 indicates two gas holes 51 that are opened at the same height and at the same angle of 60°, made between an imaginary line passing through a gas hole of the gas holes 51 and the point E on the central axis of the gas supply pipe 50 and the imaginary line D connecting the point C on the central axis and the point E on the central axis of the gas supply pipe 50.

A gas hole type 4 of (d) of FIG. 4 indicates two gas holes 51 that are opened at the same height and at the same angle of 90°, made between an imaginary line passing through a gas hole of the gas holes 51 and the point E on the central axis of the gas supply pipe 50 and the imaginary line D connecting the point C on the central axis and the point E on the central axis of the gas supply pipe 50. In the gas holes 51 of the gas hole types 2 to 4, gas is supplied to both sides at each angle with respect to the center of the product substrate W.

The gas holes 51 of the gas hole types 2 to 4 are examples of first gas holes that are opened at the same height and at the same angle around the point E on the central axis of the gas supply pipe 50 from the imaginary line D connecting the point C on the central axis of the plurality of product substrates W and the point E on the central axis of the gas supply pipe 50. The gas hole of the gas hole type 1 is an example of a second gas hole that is opened in the same direction as the imaginary line D connecting the point C on the central axis of the plurality of product substrates W and the point E on the central axis of the gas supply pipe 50.

In the gas supply pipe 50 according to the present embodiment, the opening angle of the multiple gas holes 51 arranged in the height direction from the top toward the bottom (hereinafter, simply referred to as "the angle of the gas holes 51") is changed. As a result, the inplane uniformity of the film formed in the region from the bottom to the top can be made uniform.

Figure 5:
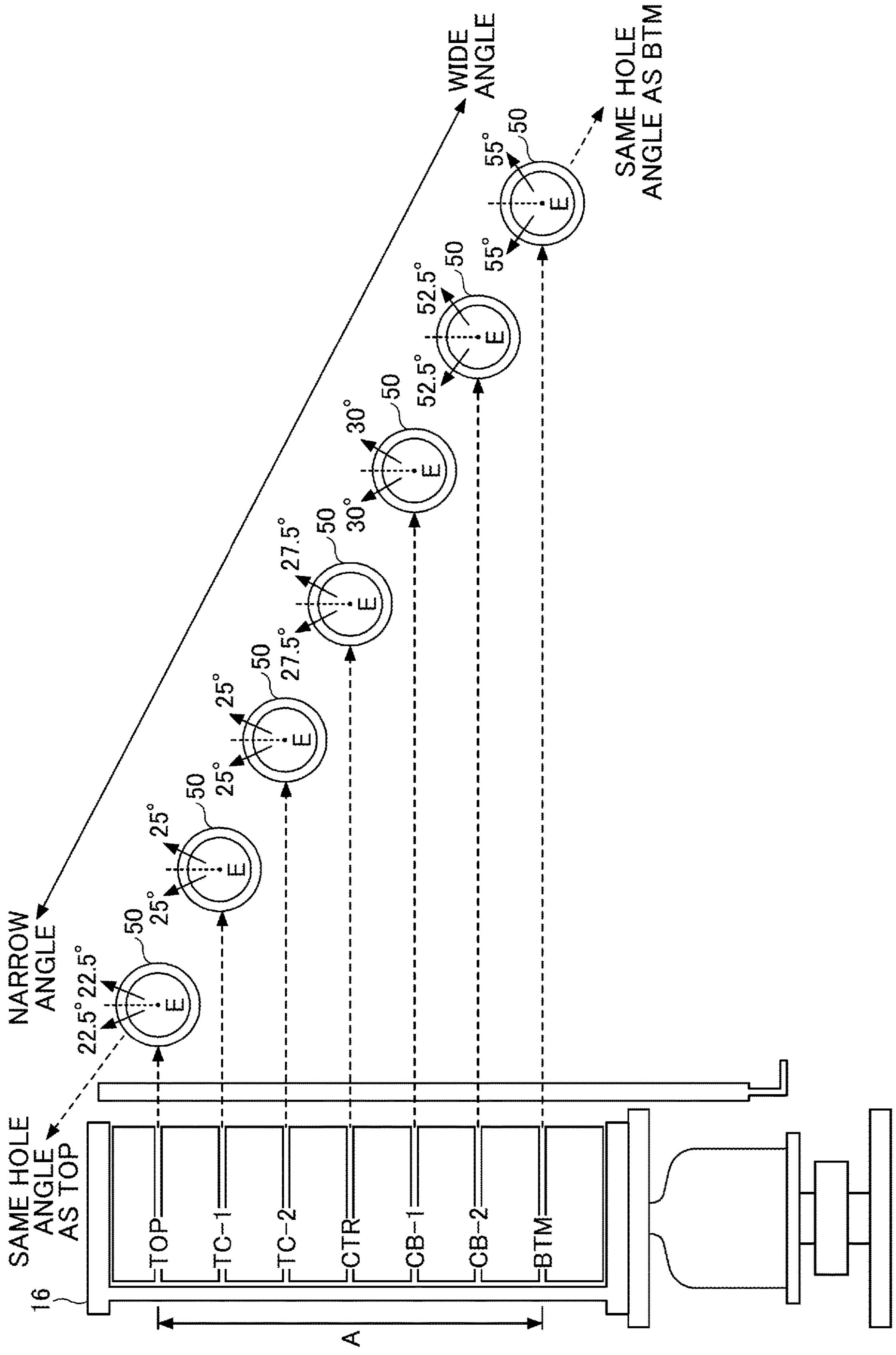
FIG. 5 is a diagram illustrating an example of a plurality of zones and angles of the gas holes according to an embodiment.

FIG. 5 is a diagram illustrating an example of a plurality of zones and angles of the gas holes according to the embodiment. In FIG. 5, the angle of the gas hole 51 is indicated by an arrow. In the example of FIG. 5, the height range A in which a plurality of product substrates W are situated is divided into a plurality of zones at the heights of "TOP", "TC-1", "TC-2", "CTR", "CB-1", "CB-2", and "BTM" in order from the top.

Two gas holes 51 at each height are arranged vertically in the "TOP" to the "TC-1" regions are opened at the same height at an angle of ±22.5° from the point E with respect to a line (an imaginary line D of FIG. 4) connecting any point C on the central axis of the plurality of product substrates W and any point E on the central axis of the gas supply pipe 50.

Two gas holes 51 at each height are arranged vertically in the "TC-1" to the "TC-2" regions opened at the same height at an angle of ±25° from the point E with respect to the imaginary line D.

Two gas holes 51 at each height are arranged vertically in the "TC-2" to the "CTR" regions opened at the same height at an angle of ±25° from the point E with respect to the imaginary line D.

Two gas holes 51 at each height are arranged vertically in the "CTR" to the "CB-1" regions opened at the same height at the same angle of ±27.5° from the point E with respect to the imaginary line D.

Two gas holes 51 at each height are arranged vertically in the "CB-1" to the "CB-2" regions opened at the same height at the same angle of ±30° from the point E with respect to the imaginary line D.

Two gas holes 51 at each height are arranged vertically in the "CB-2" to the "BTM" regions opened at the same height at the same angle of ±52.5° from the point E with respect to the imaginary line D.

Two gas holes 51 arranged vertically below the "BTM" are opened at the same height at the same angle of ±55° from the point E with respect to the imaginary line D. Two gas holes 51 arranged vertically above the "TOP" are opened at the same height at the same angle of ±22.5° from the point E with respect to the imaginary line D.

According to the gas supply pipe 50, the angle of the gas holes 51 that are opened at the same angle around the point E on the central axis of the gas supply pipe 50 is gradually widened from the "TOP" toward the "BTM". Therefore, the inplane uniformity of the film thickness formed on the product substrate W can be made uniform in the height range A in which the plurality of product substrates W are situated.

However, the angle of the gas hole 51 illustrated in FIG. 5 is an example and is not limited thereto. Further, the inplane distribution of the film may also be adjusted by changing the angle of the gas hole 51 arranged at each height of the gas supply pipe 50. For example, by changing the angle of the gas hole 51 arranged at each height of the gas supply pipe 50, the inplane distribution of the film can be adjusted. For example, by changing the angle of the gas hole 51, the inplane distribution of the film can be adjusted to be a convex type (a thickness of the center of the film is thicker than the surrounding film), a concave type (a thickness of the center of the film is thinner than the surrounding film), or a flat type.

Figure 6:
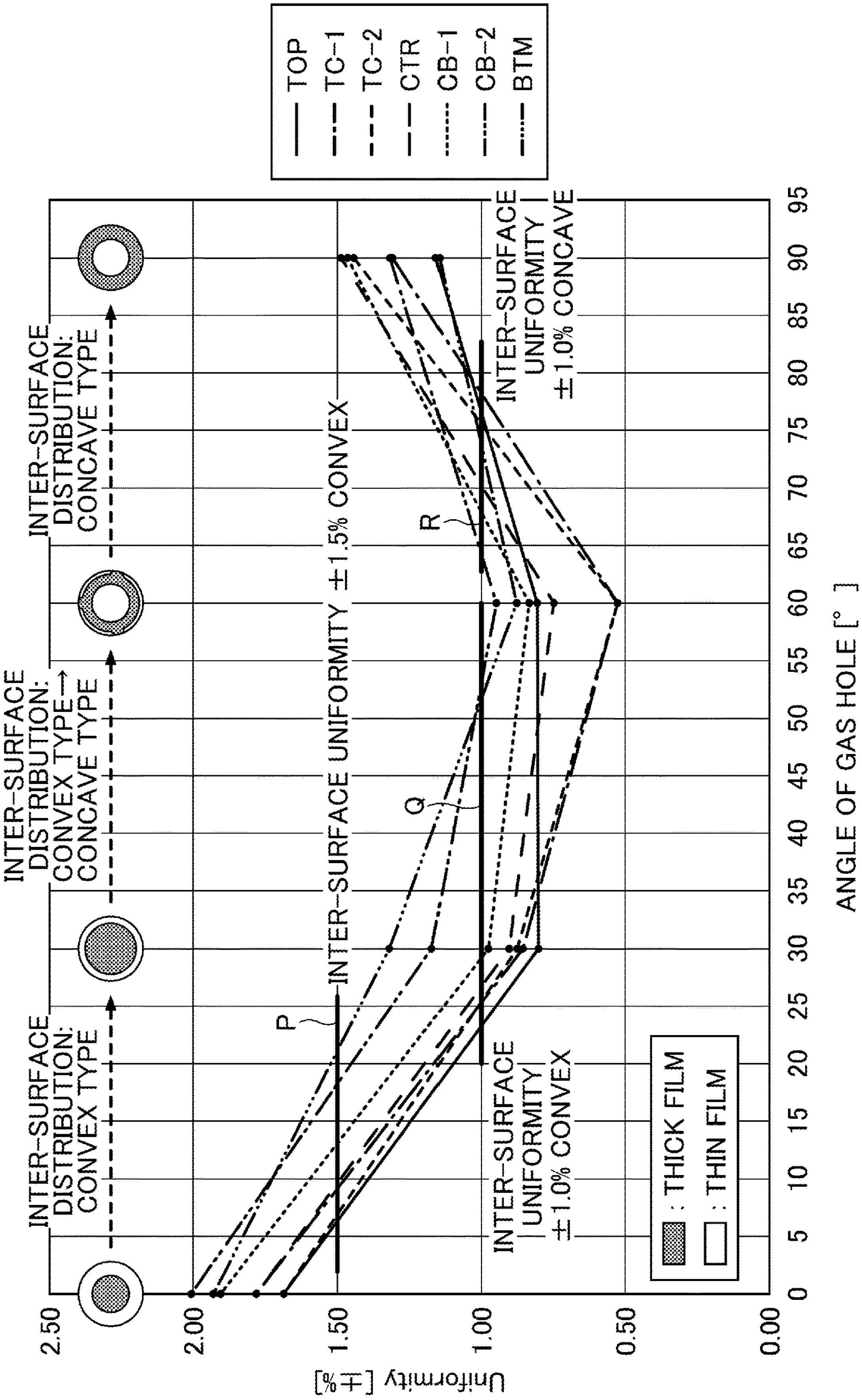
FIG. 6 is a graph illustrating an example of a measurement result of the angle of the gas hole and the inplane distribution of a film thickness according to an embodiment.

FIG. 6 is a graph illustrating an example of a measurement result of the angle of the gas hole of the gas supply pipe 50 and the inplane distribution of the film thickness according to the embodiment. This graph is an example of the results obtained by supplying silicon gas and measuring the inplane distribution of the film of the substrate using the gas holes 51 at each angle.

The horizontal axis of the graph is an angle (°) of the gas hole, and the vertical axis is the percentage of inplane uniformity. According to the graph, when the angle of the gas hole 51 is changed from 0° to 90°, the inplane distribution of the film gradually changes from a convex type where the center of the substrate is thicker than the edge to a concave type where the center of the substrate is thinner than the edge. Further, when the angle of the gas hole 51 is changed from 0° to 90°, tendency of the change in the value of the inplane uniformity from "TOP" to "BTM" is generally the same. The greater the value of the inplane uniformity of the film, the higher the uniformity.

FIG. 7 is a table illustrating an example of a measurement result of the angle of the gas hole and the inplane distribution of a film thickness according to an embodiment. A "±1.5%/convex" in FIG. 7 represents the angle between the line P of FIG. 6 and the intersection of each line from "TOP" to "BTM" as the angle of each gas hole 51 from "TOP" to "BTM". Accordingly, when it is desired to adjust a film thickness to an inplane distribution having an inplane uniformity of ±1.5% convex type, a gas supply pipe 50 having two sets of gas holes 51 having the angle illustrated in the table at the same height in each slot from the "TOP" to the "BTM" in FIG. 7 is manufactured to be disposed in the film forming apparatus 1. This enables to form a film with an inplane distribution having an inplane uniformity of ±1.5% convex type in each slot from the "TOP" to the "BTM."

Similarly, a "±1.0%/convex" in FIG. 7 represents the angle between the line Q of FIG. 6 and the intersection of each line from "TOP" to "BTM" as the angle of each gas hole 51 from "TOP" to "BTM". Accordingly, when it is desired to adjust a film thickness to an inplane distribution having an inplane uniformity of ±1.0% convex type, a gas supply pipe 50 having two sets of gas holes 51 having the angle illustrated in the table at the same height in each slot from the "TOP" to the "BTM" in FIG. 7 is manufactured to be disposed in the film forming apparatus 1. This enables to form a film with an inplane distribution having an inplane uniformity of ±1.0% convex type in each slot from the "TOP" to the "BTM."

Similarly, a "±1.0%/concave" in FIG. 7 represents the angle between the line R of FIG. 6 and the intersection of each line from "TOP" to "BTM" as the angle of each gas hole 51 from "TOP" to "BTM". Accordingly, when it is desired to adjust a film thickness to an inplane distribution having an inplane uniformity of ±1.0% concave type, a gas supply pipe 50 having two sets of gas holes 51 having the angle illustrated in the table at the same height in each slot from the "TOP" to the "BTM" in FIG. 7 is manufactured to be disposed in the film forming apparatus 1. This enables to form a film with an inplane distribution having an inplane uniformity of ±1.0% concave type in each slot from the "TOP" to the "BTM."

Figure 8:
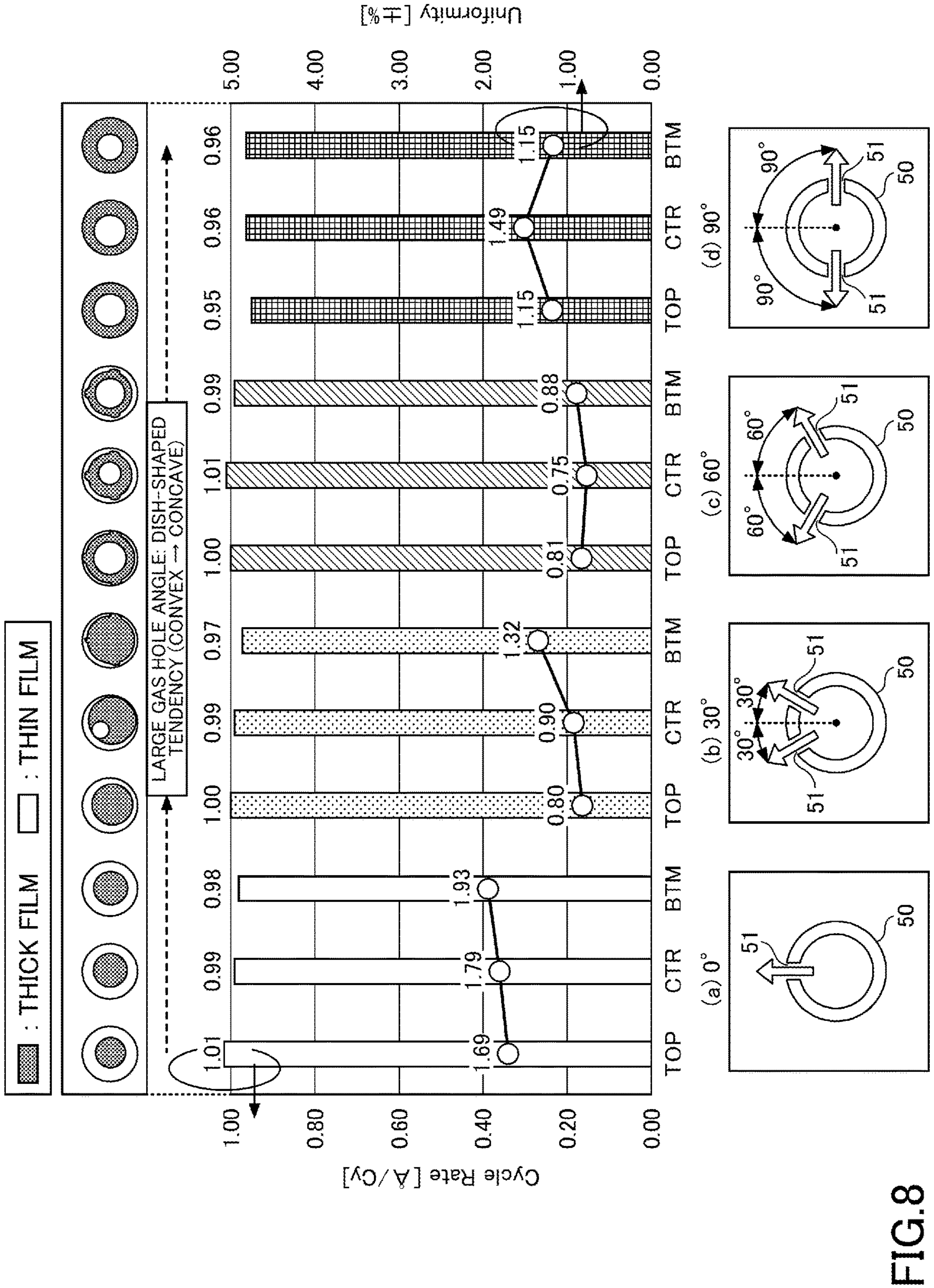
FIG. 8 is a graph illustrating an example of a measurement result of the angle of the gas hole and a cycle rate according to an embodiment.

FIG. 8 is a graph illustrating an example of a measurement result of the angle of the gas hole and a cycle rate according to the embodiment. With regard to the horizontal axis, (a) indicates the gas hole type 1 of (a) of FIG. 4, (b) indicates the gas hole type 2 of (b) of FIG. 4, (c) indicates the gas hole type 3 of (c) of FIG. 4, and (d) indicates the gas hole type 4 of (d) of FIG. 4. The cycle rate on the vertical axis of FIG. 8 indicates the film formation rate.

In the case of the gas hole type 1 of (a) of FIG. 4, the cycle rate is higher than that of the other gas hole types in any of "TOP", "CTR", and "BTM". Further, in any of "TOP," "CTR," or "BTM," the inplane distribution of the film is a convex type in which the center region of the product substrate is thicker than the edge region.

In the case of the gas hole type 2 of (b) of FIG. 4, the cycle rate is slightly lower than that of the gas hole type 1 in any of "TOP", "CTR", and "BTM". Further, in any of "TOP," "CTR," or "BTM," the inplane distribution of the film is a convex type in which the center region of the product substrate is slightly thicker than the edge region.

In the case of the gas hole type 3 of (c) of FIG. 4, the cycle rate is slightly lower than that of the gas hole type 1 in any of "TOP", "CTR", and "BTM". Further, in any of "TOP," "CTR," or "BTM," the inplane distribution of the film is a flat type in which an intermediate region between the center region and the edge region of the product substrate is slightly thick.

In the case of the gas hole type 4 of (d) of FIG. 4, the cycle rate is slightly lower than that of the gas hole type 1 in any of "TOP", "CTR", and "BTM". Further, in any of "TOP," "CTR," or "BTM," the inplane distribution of the film is a concave type in which the edge region of the product substrate is thicker than the center region.

Thus, referring to the graph of FIG. 6 or the table of FIG. 7, the gas supply pipe 50 having the desired inplane distribution of the film is produced.

The gas supply pipe 50 can be used to adjust the inplane uniformity or the inplane distribution of the film thickness formed on the product substrate W within the range A in which the plurality of product substrates W are situated. For example, by changing the angle of the gas hole 51, the inplane distribution of the film can be adjusted to be a convex type (a thickness of the center of the film is thicker than the surrounding of the film), a concave type (a thickness of the center of the film is thinner than the surrounding of the film), or a flat type.

For example, when an electronic device is formed on the substrate W and a surface area of the substrate W increases, gas is not readily supplied from the edge to the center. In this case, the inplane distribution of the convex type film is desirable. In this case, a gas supply pipe 50 having gas holes 51 that are opened at an adjustable angle to the inplane distribution of the convex type film is used. The reason is that even if the concentration of the gas at the center of the substrate W is reduced due to the large surface area of the substrate W, the film thickness at the center is large in the first place, so that the inplane uniformity of the film can be maintained by using the gas supply pipe 50. For example, when etching the substrate W, the inplane distribution of the concave type film is desirable because the edge side of the substrate W tends to be etched more easily than the center side. In this case, a gas supply pipe 50 having gas holes 51 that are opened at an adjustable angle to the inplane distribution of the concave type film is used.

<Modification>

Figure 9:
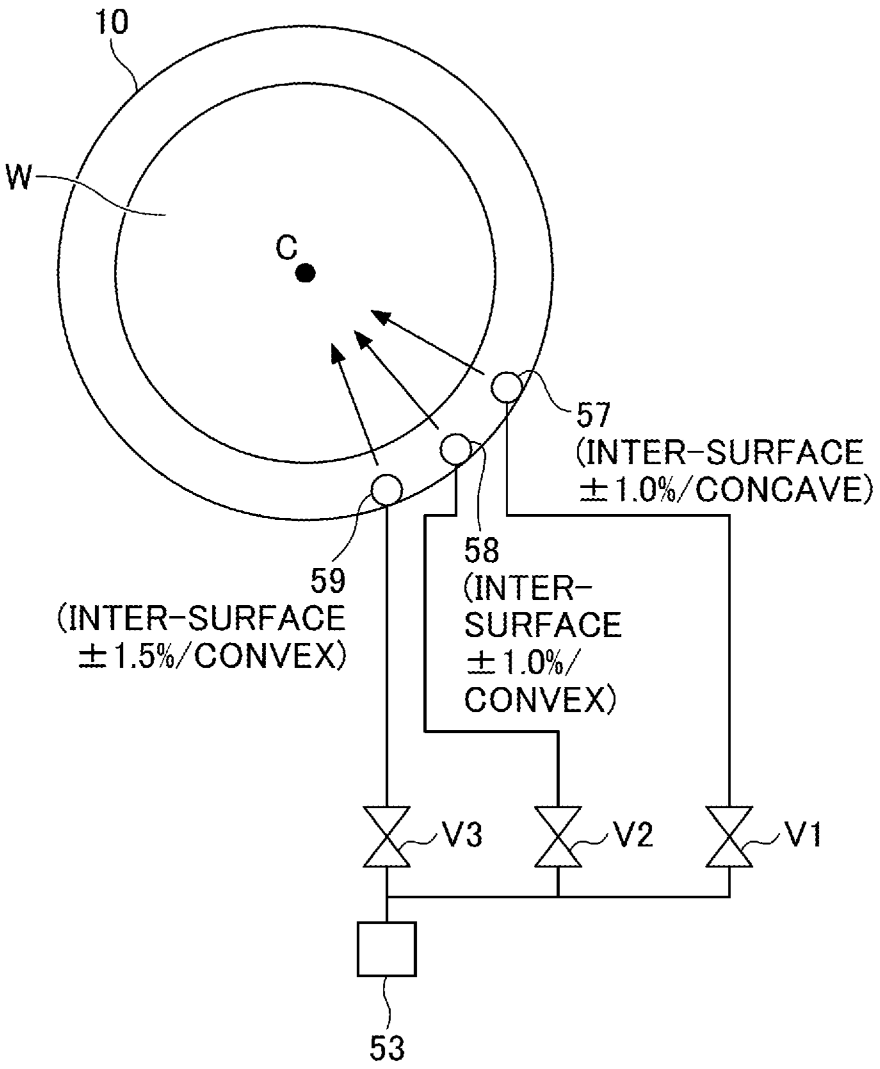
FIG. 9 is a diagram illustrating an arrangement of a plurality of gas supply pipes according to an embodiment.

FIG. 9 is a diagram illustrating an arrangement of a plurality of gas supply pipes according to an embodiment. In FIG. 9, gas supply pipes 58 and 59 are arranged in the processing chamber 10 to adjust the inplane distribution of the film to be a convex type (e.g., inplane uniformity ±1.0% convex type, ±1.5% convex type) and a gas supply pipe 57 is arranged to adjust the inplane distribution of the film to be a concave type (e.g., inplane uniformity ±1.0% concave type). Each of the gas supply pipes 57 to 59 is connected to a gas source 53 via a gas supply line. Each of the gas supply pipes 57 to 59 supplies gas from either of the gas supply pipes 57 to 59 into the processing chamber 10 by turning on and off the respective valves V1, V2, and V3 provided in the gas supply line. Therefore, the inplane distribution of the thickness of the film formed on the substrate W can be adjusted to be convex or concave with the predetermined inplane uniformity value according to the type and condition of the process. Thus, the inplane distribution of the film can be controlled by the process by switching the valve without changing the angle of the gas hole 51.

<Gas Supply Pipe According to Gas Species and Process>

A plurality of gas supply pipes 50 including multiple gas holes 51 having an angle set according to the inplane distribution of the film to be formed on each of the plurality of product substrates and set for each gas species may be arranged in the processing chamber 10 corresponding to various gas species.

In this case, a switching unit is provided for switching the gas supply pipe 50 to be used according to various gas species. The valves V1, V2, and V3 are an example of the switching unit for switching the gas supply pipe 50 to be used from the plurality of gas supply pipes 50 according to the gas used for the product substrate W.

Figure 10:
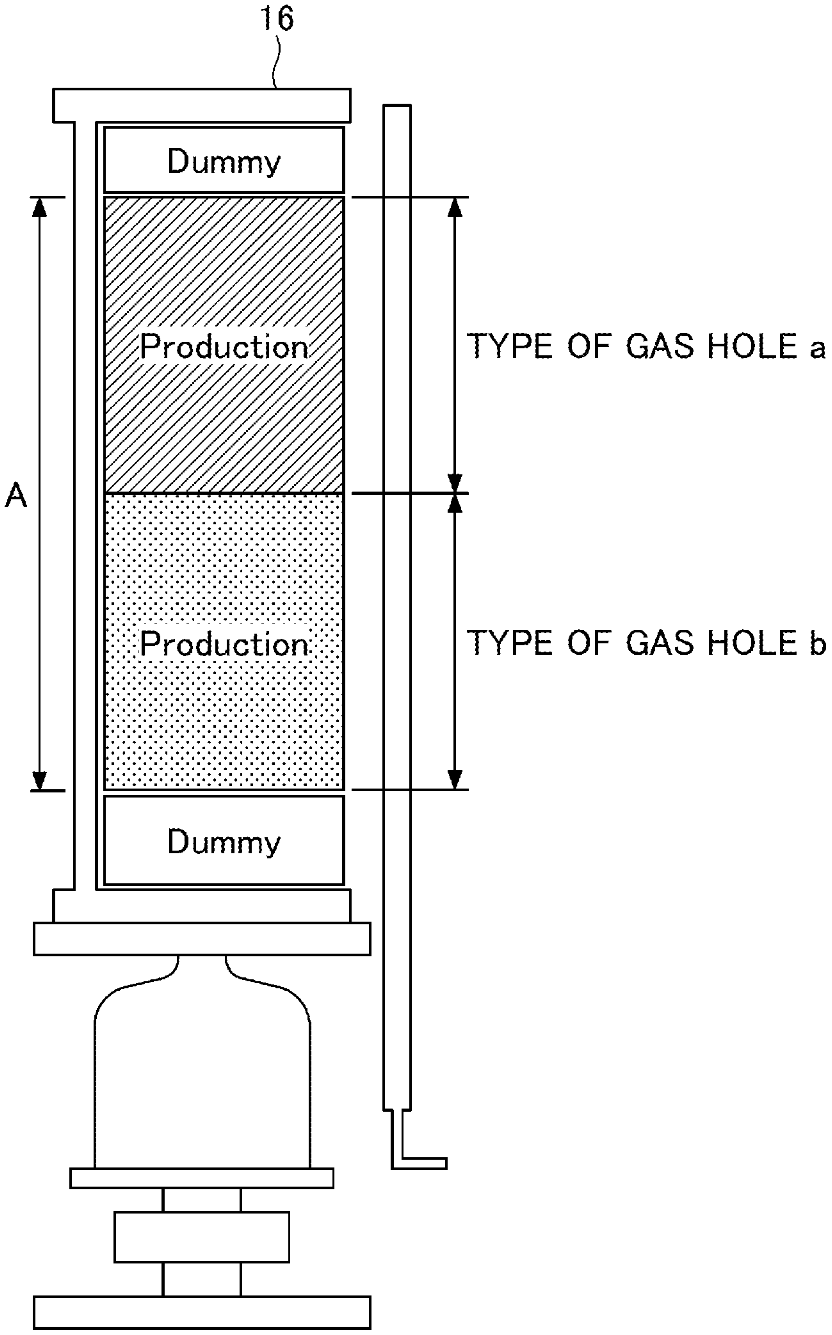
FIG. 10 is a diagram illustrating an example of a control of the angle of the gas hole and the inplane distribution of a film thickness according to an embodiment.

As illustrated in FIG. 10, by changing the angle of the gas hole 51 of the gas supply pipe 50 arranged according to the product substrate W (production) in each slot, different products can be processed simultaneously. For example, as illustrated in FIG. 10, a gas supply pipe 50 may be arranged in the processing chamber 10, wherein in the upper half of the range A where a plurality of product substrates W in the wafer boat 16 are situated gas holes 51 of a gas hole type a and in the lower half gas holes 51 of a gas hole type b. Accordingly, the gas hole 51 of the gas hole type a in the upper half can execute a process, and the gas hole 51 of the gas hole type b in the lower half can execute another process. This enables processing of various product substrates W at one time without maintenance.

Note that the number of gas holes arranged at the same height is not limited to two, but may be three or more. In the gas supply pipe 50, multiple gas holes 51 can be similarly formed not only in quartz but also in other members such as $SiO_2$, SiC, metal members, stainless steel (SUS), or the like.

In the above embodiment, the ALD method has been described as an example of the film forming process. However, the present disclosure is not limited thereto. For example, the present disclosure can be applied to a chemical vapor deposition (CVD) method as well. Further, the present disclosure can be applied not only to the film forming process but also to a process of supplying cleaning gas and cleaning the inside of the processing chamber 10 by the CVD method. For example, the present disclosure can be applied to cleaning the backside of the gas supply pipes 50*a*, 50*b*, and 50*c*, focused gas supply of the BTM section, or the like, by supplying the cleaning gas from the gas holes having different angles. Further, the present disclosure can be applied to a process of supplying etching gas and etching the inside of the processing chamber 10 by the CVD method. The type of film to be formed is not limited to the film formation by raw material gas and reaction gas. For example, a polysilicon film using only the raw material gas can be formed.

As described above, according to the film forming apparatus according to the present embodiment, the controllability of the inplane distribution of the film can be increased.

The film forming apparatus according to the embodiments disclosed herein should be considered to be exemplary in all respects and not limiting. The embodiments can be modified and improved in various forms without departing from the appended claims and gist thereof. The matters described in the plurality of embodiments may have other configurations within a consistent range, and may be combined within a consistent range.

What is claimed is:

1. A film forming apparatus comprising:

a processing chamber including an inner tube and an outer tube surrounding the inner tube, wherein the inner tube includes a gas exhaust port for exhausting gas in the inner tube;

a first gas supply pipe coupled to a first gas source for supplying a first type of gas and a second gas supply pipe coupled to a second gas source, which is separated from the first gas source, for supplying a second type of gas that is different from the first type of gas, wherein each of the first gas supply pipe and the second gas supply extends vertically in the processing chamber and including a plurality of gas holes, including a plurality of first gas holes and a single second gas hole, each of the plurality of gas holes of the first gas supply pipe has a same opening size, wherein all of the plurality of first gas holes of the first gas supply pipe are arranged in two columns extending along the first gas supply pipe, each first gas hole of one column of the first gas supply pipe and a corresponding first gas hole of the other column of the first gas supply pipe are at an equal height, all of the first gas holes of the second gas supply pipe being arranged in two columns extending along the second gas supply pipe, each first gas hole of one column of the second gas supply pipe and a corresponding first gas hole of the other column of the second gas supply pipe are at an equal height; and a boat configured to accommodate a plurality of substrates including product substrates in a vertical direction in the processing chamber, wherein a height of the gas exhaust port is identical to or greater than a total height of the boat, wherein the film forming apparatus forms a film on each of the plurality of substrates by use of gas supplied from the plurality of gas holes, each of the plurality of substrates corresponding to respective one or more of the plurality of gas holes, and wherein gas holes among the plurality of gas holes that are arranged in a height range in which the product substrates are situated include the first gas holes that are opened at a same height, the first gas holes being oriented at respective angles such that respective imaginary lines passing through the first gas holes and a central axis of the first gas supply pipe are at a same angle relative to a first imaginary line passing through the central axis of the first gas supply pipe and a center of a corresponding one of the product substrates, and respective imaginary lines passing through the first gas holes and a central axis of the second gas supply pipe are at an identical angle relative to a second imaginary line passing through the central axis of the second gas supply pipe and the center of the corresponding one of the product substrates, wherein the first gas supply pipe includes a plurality of the first gas holes at a first height and a plurality of the first gas holes at a second height greater than the first height, an angular separation between two of the first gas holes about the central axis of the first gas supply pipe at the first height being different from an angular separation between two of the first gas holes about the central axis of the first gas supply pipe at the second height, wherein the second gas supply pipe includes a plurality of the first gas holes at a third height that is identical to the first height and a plurality of the first gas holes at a fourth height greater than the third height, an angular separation between two of the first gas holes about the central axis of the second gas supply pipe at the third height being different from an angular separation between two of the first gas holes about the central axis of the second gas supply pipe at the fourth height, wherein the film forming apparatus further comprises at least one valve configured to switch between the first gas supply pipe and the second gas supply pipe to supply gas into the processing chamber, so as to adjust an inplane distribution of the film formed on the product substrates, wherein an angular separation between two of the first gas holes of the first gas supply pipe about the central axis of the first gas supply pipe at the first height is different from an angular separation between two of the first gas holes of the second gas supply pipe about the central axis of the second gas supply pipe at the third height, wherein an angle between a gas discharge direction of each of the first gas holes of the first gas supply pipe at the first height and the first imaginary line is greater than 0 degree and less than or equal to 90 degrees, wherein an angle between a gas discharge direction of each of the first gas holes of the second gas supply pipe at the third height and the second imaginary line is greater than 0 degree and less than or equal to 90 degrees, and wherein the plurality of gas holes, arranged in the height range in which the plurality of product substrates are situated, includes the single second gas hole positioned at a top of the first gas supply pipe, the single second gas hole being opened in a same direction as the first imaginary line.

2. The film forming apparatus according to claim 1, wherein the processing chamber includes a plurality of zones, the first gas supply pipe including a first plurality of the first gas holes in a first zone and a second plurality of the first gas holes in a second zone above the first zone, an angular separation between two of the first gas holes in the first zone about the central axis of the first gas supply pipe is different from an angular separation between two of the first gas holes in the second zone about the central axis of the first gas supply pipe.

3. The film forming apparatus according to claim 1, wherein the at least one valve is further configured to switch between the first gas supply pipe and the second gas supply pipe according to species of gas to be supplied.

4. The film forming apparatus according to claim 1, further comprising a plurality of temperature sensors disposed between the inner tube and the outer tube, wherein the plurality of temperature sensors are arranged in the vertical direction in the processing chamber, and each of the plurality of temperature sensors is respectively provided at positions that are offset by a predetermined angle from a position of the gas exhaust port in a circumferential direction of the inner tube.

5. The film forming apparatus according to claim 1, wherein the first gas supply pipe has the first gas holes oriented at an angle configured to adjust the inplane distribution of the film to be a convex type in which a thickness of a center of the film is thicker than a surrounding of the film, and wherein the second gas supply pipe has the first gas holes oriented at an angle configured to adjust the inplane distribution of the film to be a concave type in which a thickness of the center of the film is thinner than the surrounding of the film.

6. The film forming apparatus according to claim 1, further comprising a controller operatively coupled to the at least one valve, wherein the controller is configured to control the at least one valve to switch between the first gas supply pipe and the second gas supply pipe according to a process, so as to control the inplane distribution of the film without changing the respective angles of the first gas holes.

* * * * *